(12) United States Patent
Kauranen et al.

(10) Patent No.: US 7,372,696 B2
(45) Date of Patent: May 13, 2008

(54) COOLING DEVICE AND METHOD FOR ELECTRONIC APPARATUS

(75) Inventors: Mattl Kauranen, Espoo (FI); Mika Silvennoinen, Espoo (FI); Mika Sares, Röykkä (FI)

(73) Assignee: ABB Oy, Helsinki (FI)

( * ) Notice: Subject to any disclaimer, the term of this patent is extended or adjusted under 35 U.S.C. 154(b) by 56 days.

(21) Appl. No.: 11/335,271

(22) Filed: Jan. 20, 2006

(65) Prior Publication Data
US 2006/0158847 A1 Jul. 20, 2006

(30) Foreign Application Priority Data
Jan. 20, 2005 (FI) .................................. 20055029

(51) Int. Cl.
*H05K 7/20* (2006.01)
(52) U.S. Cl. ..................................... 361/692
(58) Field of Classification Search ................ 361/692, 361/700, 694–695, 690; 174/16.1, 15.1; 165/122, 80.2, 104.33; 29/890.07
See application file for complete search history.

(56) References Cited

U.S. PATENT DOCUMENTS

| | | | |
|---|---|---|---|
| 5,424,915 A | | 6/1995 | Katooka et al. |
| 5,440,450 A | | 8/1995 | Lau et al. |
| 5,456,632 A | | 10/1995 | Ohtsu et al. |
| 5,463,967 A | * | 11/1995 | Gielow et al. .......... 110/104 R |
| 6,575,230 B1 | * | 6/2003 | Kadota et al. ......... 165/104.33 |

FOREIGN PATENT DOCUMENTS

| | | |
|---|---|---|
| DE | 203 00 689 U1 | 4/2003 |
| EP | 0 356 991 B1 | 3/1990 |
| EP | 0 810 511 B1 | 12/1997 |
| JP | 11-112177 | 4/1999 |

OTHER PUBLICATIONS

Finnish Office Action dated Oct. 26, 2005.
European Search Report dated Mar. 27, 2006.

* cited by examiner

*Primary Examiner*—J. F. Duverne
(74) *Attorney, Agent, or Firm*—Buchanan Ingersoll & Rooney PC

(57) ABSTRACT

The present invention relates to a cooling device for an electronic apparatus comprising: a cooling element to be connected to an electronic component for receiving the heat load generated by the electronic component, an inlet port, an outlet port and a fan for bringing air to flow from the inlet port via the cooling element to the outlet port to cool the cooling element by means of the air flow. In order to achieve a simple device improving the reliability the cooling device comprises at least one return channel, through which some of the air flowing from the cooling element towards the outlet port is conducted to an electronic space to cool the electronic space, and that a forepart of the return channel is arranged in a place where the air flow from the cooling element towards the outlet port is colder than the air flowing from the cooling element on average. The invention also relates to a cooling method.

8 Claims, 3 Drawing Sheets

COOLING DEVICE AND METHOD FOR ELECTRONIC APPARATUS

FIELD OF THE INVENTION

The present invention relates to a cooling device for an electronic apparatus that enables to provide simple and efficient cooling for an electronic component fastened to a cooling element and in an electronic space of the electronic apparatus. The invention also relates to a cooling method.

DESCRIPTION OF THE PRIOR ART

A solution is previously known, in which cooling is carried out in electronic apparatuses such that the power electronic component is fastened to a cooling element, through which an air flow is arranged by means of a fan. Thus the heat load received from the power electronic component of the cooling element is transferred through the cooling element to the air flowing out from the electronic apparatus. Since the electronic apparatus is also provided with an electronic space, which includes other components requiring cooling, the known solution employs another fan, and the air flow provided by means thereof is directed through the electronic space in order to achieve adequate cooling in the electronic space.

A disadvantage with the solution mentioned above is that it requires two fans in order to ensure adequate cooling. Another disadvantage is that cold air is brought from outside the device to the electronic space that may be damp. Bringing such air to the electronic space increases significantly the risk of corrosion and the risk of malfunctions caused by corrosion.

Solutions are also previously known in which the same air flow provided with a single fan is employed to cool a cooling element connected to the power electronic component and the electronic space. Then the air flowing from outside the device through the inlet port is at first conducted through the electronic space, and thereafter through the cooling element to the outlet port. Consequently the need for two separate fans is avoided. However, what remains a problem is still the fact that the cold air flowing from outside the device may cause corrosion in the electronic space.

BRIEF DESCRIPTION OF THE INVENTION

It is an object of the present invention to solve the problem described above and to provide a cooling solution to be used that is simple and improves the reliability of the device in the long run. This object is achieved with a cooling device according to the accompanying independent claim 1 and with a method according to the accompanying independent claim 7.

In the invention some of the air that flows through the cooling element is separated to be circulated through the electronic space. Thus conducting cold and possibly damp air to the electronic space is avoided. An adequate cooling in the electronic space is achieved by separating air from the air flow flowing towards the outlet port from the cooling element, the separated air being colder than the air flowing from the cooling element on average. The temperature of the separated air flow is therefore lower than the temperature of the air passing through the cooler on average. Conducting air that is too hot to the electronic space is thus avoided.

In a preferred embodiment of the invention a return channel that is used to bring air to the electronic space continues from the electronic space to the inlet port of the device. This preferred embodiment provides such an advantage that the flow of air flowing through the electronic space becomes more efficient, since the lower pressure prevailing at the inlet port provides a suction effect assisting the flow of air.

The preferred embodiments of the cooling device and the cooling method according to the invention are disclosed in the accompanying dependent claims 2 to 6 and 8 to 9.

BRIEF DESCRIPTION OF THE DRAWINGS

In the following the invention will be explained in greater detail by way of example with reference to the accompanying drawings, in which.

DESCRIPTION OF EMBODIMENTS

Figure 1:
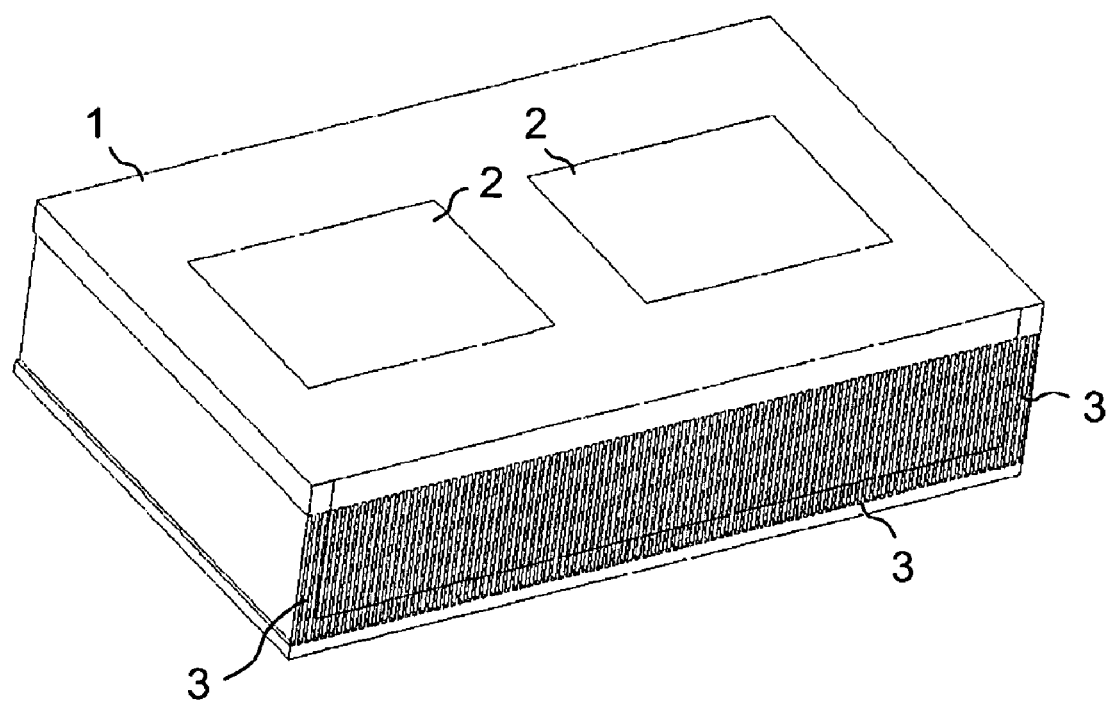
FIGS. 1 and 2 illustrate a first preferred embodiment of the invention.
Figure 2:
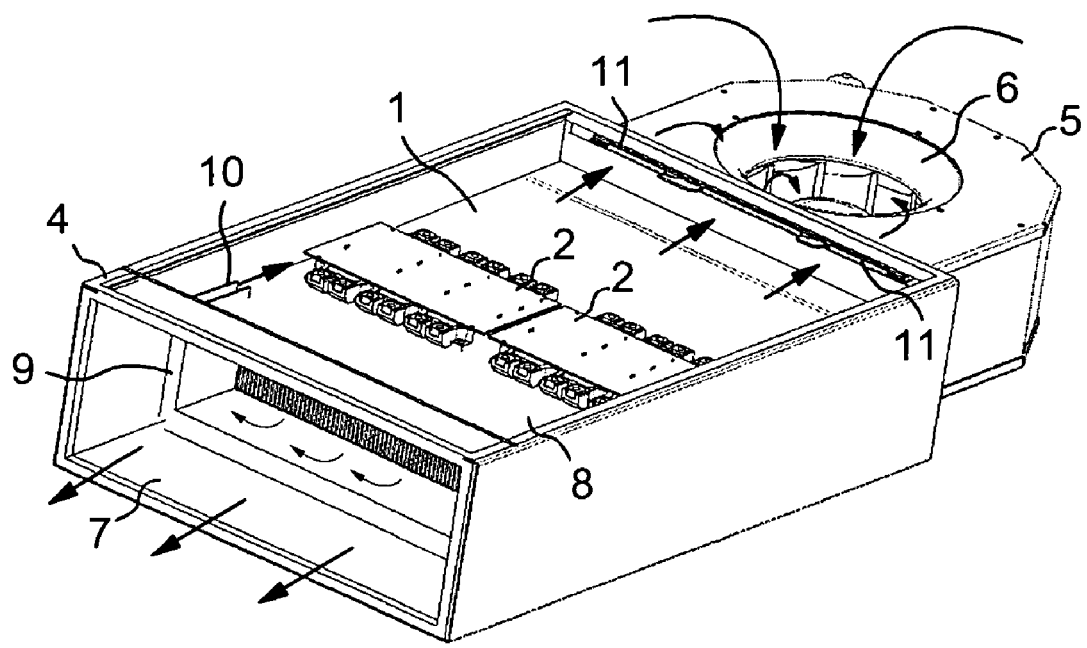

FIGS. 1 and 2 illustrate a first preferred embodiment of the invention. FIG. 1 shows a cooling element 1. It is assumed in the example case shown in the Figures that the cooling element is formed of parallel plate-like cooling fins, between which air is able to flow.

An electronic component 2 is connected to the surface of the cooling element 1, the number of the electronic components in the case shown in FIGS. 1 and 2 is two. The heat load generated by the electronic components is thus transferred through the cooling element to the flow of air flowing through the cooling element. In FIG. 1 reference numeral 3 indicates areas of a flow area of the cooling element that are located furthest from the electronic components. When air flows through the cooling element 1 some of the air flow that is discharged from the cooling element 1 is colder in the areas 3, which are located furthest from the electronic components 2.

FIG. 2 illustrates the cooling element 1 shown in FIG. 1 when it is mounted in an electronic apparatus 4, which may for instance be a frequency converter. For clarity, the electronic apparatus is shown in FIG. 2 without an upper cover. A fan 5 (which may in practice be encased) sucks air from outside the apparatus 4 through an inlet port 6. The air flow created passes through the cooling element to the outlet port 7, from where it is discharged outside the apparatus 4. The cooling element 1 and the air flowing therethrough therefore cools the electronic components 2 connected to the cooling element.

Since other components requiring cooling may also be located in the electronic space 8 of the apparatus 4 than only electronic components 2, a return channel 10 is arranged in the apparatus 4 in accordance with the invention that allows conducting some of the flow of air flowing from the cooling element 1 towards the outlet port 7 to the electronic space 8 in order to cool this. In the case shown in FIG. 2 a control element 9 is arranged at the forepart of the return channel, the control element being located in the air flow flowing from the cooling element 1 to the outlet port 7. The control element is arranged in a place, where the air flow from the cooling element 1 towards the outlet port 7 is colder than the air flow from the cooling element on average. In practice such air flows from areas 3 shown in FIG. 1.

In the case of FIG. 2 the electronic space 8 itself forms a part of the return channel, in other words the surrounding walls that delimit the space through which the air conducted to the electronic space flows. The rear wall of the electronic space is provided with openings 11, through which the air flow conducted to the electronic space can be discharged from the electronic space. The openings 11 are preferably formed so that they conduct the air discharged from the electronic space to the inlet port 6. In addition, a case is preferably arranged around the fan, into which case the openings 11 lead. Such a solution allows improving the flow through the electronic space, since the low pressure at the inlet port 6 generates a suction to the electronic space through the openings 11.

Figure 3:
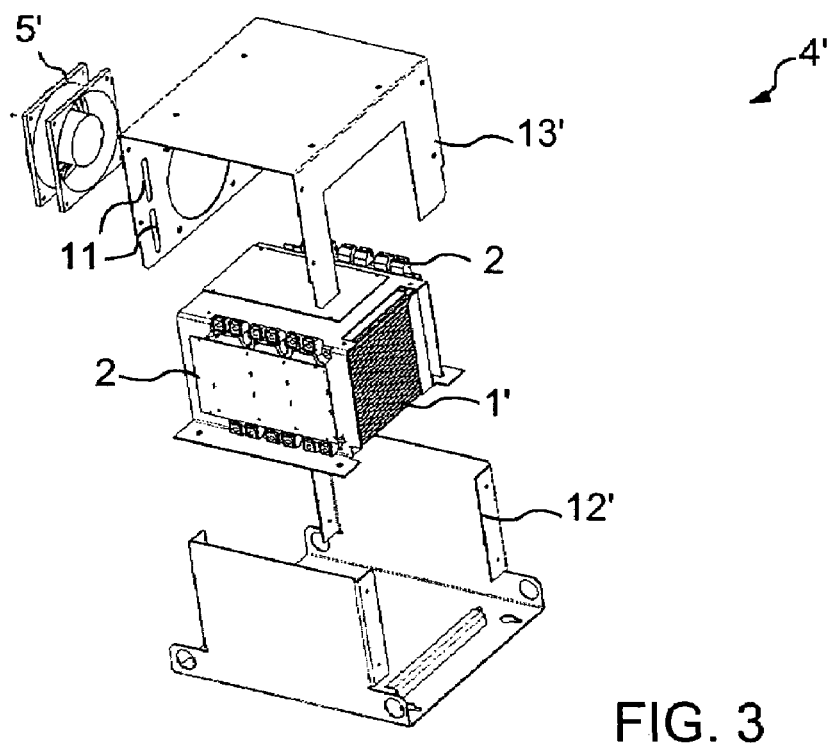
FIGS. 3 to 5 illustrate a second preferred embodiment of the invention.
Figure 4:
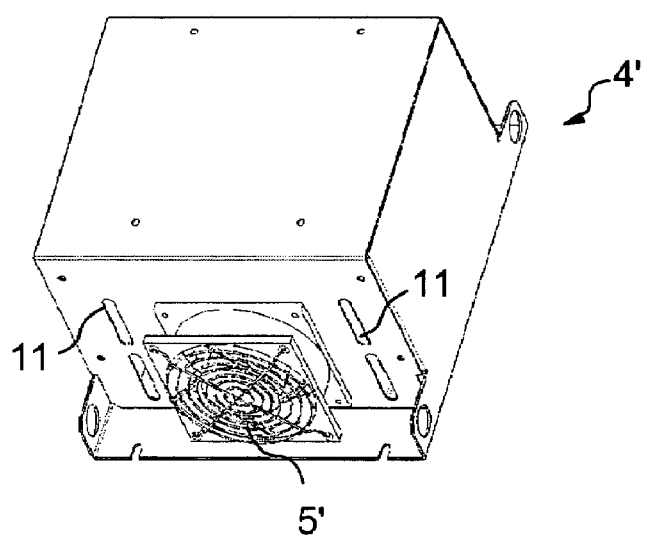
Figure 5:
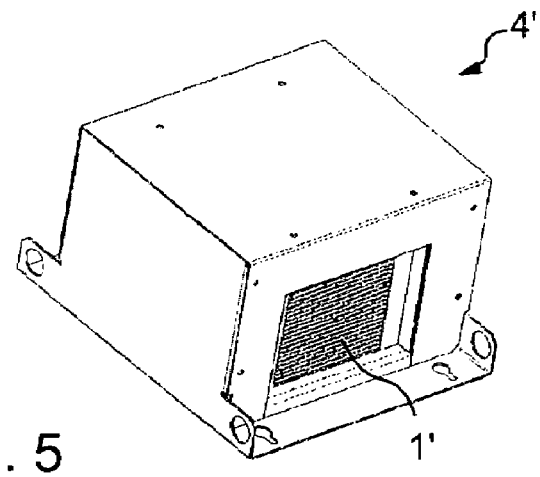

FIGS. 3 to 5 illustrate a second preferred embodiment of the invention. FIG. 3 shows an exploded view, FIG. 4 shows a rear view and FIG. 5 shows a front view of the electronic apparatus 4'. The embodiment shown in FIGS. 3 to 5 corresponds to a great extent with the embodiment shown in FIGS. 1 to 2, and therefore it will be described in the following primarily by presenting the differences between the embodiments.

In the embodiment shown in FIGS. 3 to 5 electronic components 2 are fastened to the cooling element on two opposite sides. The heat load generated by the electronic components 2 can thus be transferred through the cooling element to the flow of air flowing through the cooling element. For practical reasons the air flow conducted to the electronic space that is used to cool the other components located in the electronic space, is in this embodiment taken from the upper and lower edges of the cooling element (indicated in more detail in FIGS. 6 to 8). Covers 12' and 13' of the device delimit the electronic space, which covers further delimit the return channel inside them. The air conducted to the electronic space is discharged from the electronic space through the openings 11 to the vicinity of the inlet port of a fan 5'.

Figure 6:
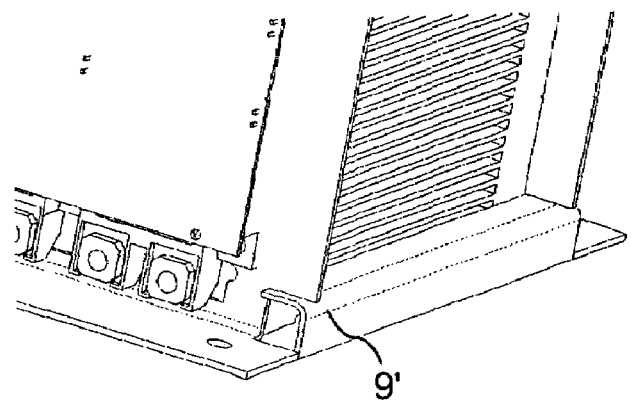
FIGS. 6 to 8 illustrate alternative designs of the forepart of a return channel.
Figure 7:
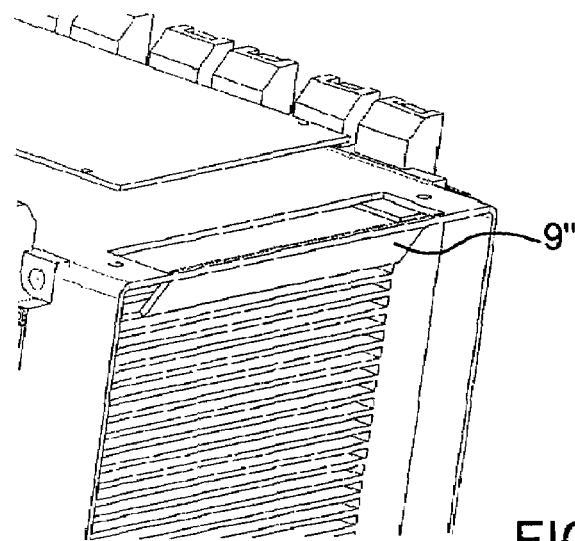
Figure 8:
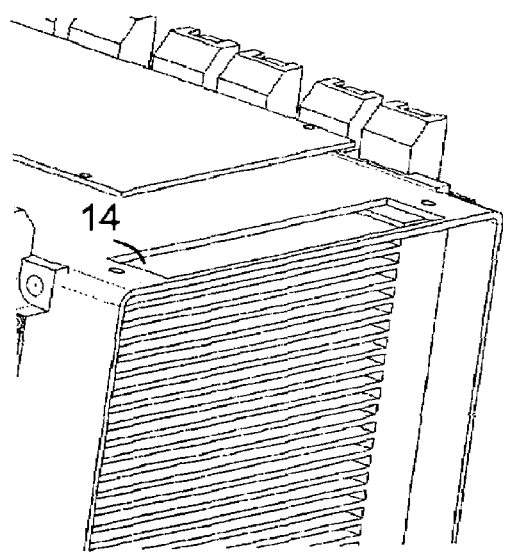

FIGS. 6 to 8 illustrate alternative designs of the forepart of the return channel. The solutions shown in FIGS. 6 to 8 can be utilized for instance in connection with the embodiment shown in FIGS. 3 to 5.

In the case shown in FIG. 6 a control element 9' that covers a part of the flow area of the cooling element is formed at the lower edge by means of the frames in the electronic apparatus. The control element 9' thus separates some of the flow of air flowing from the cooling element and conducts the separated air flow to the return channel. The control element 9' is arranged such that it is located in a place where air flows that is colder than the air flowing from the cooling element on average.

In FIG. 7 a control element 9" is formed from the upper edge of a plate bent downwards into the air flow. The plate directs some of the air flowing from the cooling element to the return channel. The control element 9" is arranged such that it is located in a place where air flows that is colder than the air flowing from the cooling element on average.

In the case illustrated in FIG. 8 a separate control element is not used. In contrast an opening 14 forming the forepart of the return channel is arranged in a place where air flows that is colder than the air flowing from the cooling element on average. In order for a sufficient amount of air to flow into the return channel it is preferable that the return channel ends at the inlet port in this embodiment so that a suction can be created in the electronic space as described previously.

Embodiments have above been described with reference to the Figures, in which the control element that is used to direct some of the flow of air flowing from the cooler to the outlet port to the return channel is in relation to the cooler formed of a separate part. However, it is possible in accordance with the invention that the control element is completely or partly formed of a cooling element. Thus the design of the cooling element is such that air from the air flow passing therethrough is directed from a desired point to the return channel.

It is to be understood that the description and the Figures associated therewith are merely intended to illustrate the present invention. Various variations and modifications of the invention will be apparent to those skilled in the art without deviating from the scope of the invention.

The invention claimed is:

1. A cooling device for an electronic apparatus, the cooling device comprising:
    a cooling element to be connected to an electronic component for receiving a heat load generated by the electronic component,
    an inlet opening,
    an outlet opening and a fan for bringing air to flow from the inlet opening via the cooling element to the outlet opening for cooling the cooling element with the air flow, and
    at least one return channel, through which some of the air flowing from the cooling element towards the outlet opening is conducted to an electronic space to cool the electronic space, and wherein
    a forepart of the return channel is arranged in a place, where the air flowing from the cooling element towards the outlet port is colder than the air flowing from the cooling element on average.

2. A cooling device as claimed in claim 1, wherein the return channel continues from the electronic space to the inlet opening in order to conduct the air conducted to the electronic space to the inlet opening.

3. A cooling device as claimed in claim 1, wherein a control element is arranged in connection with the forepart of the return channel, the control element directing some of the air flowing from the cooling element to the outlet port to the return channel.

4. A cooling device as claimed in claim 3, wherein the control element is arranged to delimit an area from a flow area of the cooling element, the area being located as far as possible from an electronic component or the electronic components connected to the cooling element.

5. A cooling device as claimed in claim 1, wherein the fan is arranged in the flow direction before the cooling element to blow air to the cooling element and to suck air from the inlet port.

6. A cooling device as claimed in claim 1, wherein the cooling element comprises plate-like cooling fins arranged in parallel and at a distance from one another and air flowing therebetween.

7. A method for cooling an electronic apparatus, the method comprising
    producing an air flow from an inlet port via a cooling element connected to an electronic component to an outlet port,
    separating air from the flow of air flowing from the cooling element to the outlet port that is colder than the air flowing from the cooling element on average, wherein the air is separated with a control element that is arranged in the flow of air flowing from the cooling element to the outlet port to delimit an area from a flow area of the cooling element, the area being located as far as possible from the electronic component or electronic components connected to the cooling element, and
    conducting the separated air to an electronic space of the electronic apparatus to cool the electronic space.

8. A method as claimed in claim 7, wherein the separated air is conducted through the electronic space to the inlet port.

* * * * *